US008093707B2

(12) United States Patent
Lee et al.

(10) Patent No.: US 8,093,707 B2
(45) Date of Patent: Jan. 10, 2012

(54) LEADFRAME PACKAGES HAVING ENHANCED GROUND-BOND RELIABILITY

(75) Inventors: Shaw Wei Lee, Cupertino, CA (US); Ein Sun Ng, Pulau Pinang (MY); Chue Siak Liu, Saratoga, CA (US); Lee Han Meng @ Eugene Lee, Johor (MY); Yee Kim Lee, Johor (MY)

(73) Assignee: National Semiconductor Corporation, Santa Clara, CA (US)

( * ) Notice: Subject to any disclaimer, the term of this patent is extended or adjusted under 35 U.S.C. 154(b) by 130 days.

(21) Appl. No.: 12/581,609

(22) Filed: Oct. 19, 2009

(65) Prior Publication Data
US 2011/0089556 A1    Apr. 21, 2011

(51) Int. Cl.
*H01L 23/495* (2006.01)

(52) U.S. Cl. ........ 257/691; 257/666; 257/670; 257/676; 257/690; 257/692; 257/E23.031; 257/E23.037; 257/E23.043

(58) Field of Classification Search .................. 257/666, 257/670, E23.031, E23.037, 676, 690–692, 257/E23.043
See application file for complete search history.

(56) References Cited

U.S. PATENT DOCUMENTS

| | | | |
|---|---|---|---|
| 5,328,079 A | 7/1994 | Mathew et al. | |
| 6,424,024 B1 * | 7/2002 | Shih et al. | 257/667 |
| 6,731,003 B2 | 5/2004 | Joshi et al. | |
| 6,972,216 B2 * | 12/2005 | Huang et al. | 438/122 |
| 7,067,413 B2 | 6/2006 | Kim et al. | |
| 7,201,580 B2 * | 4/2007 | Ho et al. | 434/219 |
| 7,205,180 B1 * | 4/2007 | Sirinorakul et al. | 438/123 |
| 7,214,606 B2 | 5/2007 | Wong et al. | |
| 7,229,906 B2 * | 6/2007 | Babinetz et al. | 438/617 |
| 2002/0024122 A1 * | 2/2002 | Jung et al. | 257/666 |
| 2002/0096766 A1 | 7/2002 | Chen et al. | |
| 2002/0163015 A1 * | 11/2002 | Lee et al. | 257/200 |
| 2004/0238921 A1 * | 12/2004 | Lee et al. | 257/666 |
| 2006/0012035 A1 | 1/2006 | Fernandez et al. | |
| 2008/0272479 A1 | 11/2008 | Bathan et al. | |

FOREIGN PATENT DOCUMENTS

WO    WO 0109953 A1 *  2/2001

OTHER PUBLICATIONS

Search Report dated Jun. 13, 2011 from International Application No. PCT/US2010/052061.
Written Opinion dated Jun. 13, 2011 from International Application No. PCT/US2010/052061.

* cited by examiner

*Primary Examiner* — A. Sefer
*Assistant Examiner* — Ermias Woldegeorgis
(74) *Attorney, Agent, or Firm* — Beyer Law Group LLP

(57) ABSTRACT

Various semiconductor package arrangements and methods that improve the reliability of wire bonding a die to ground or other outside contacts are described. In one aspect, selected ground pads on the die are wire bonded to a bonding region located on the tie bar portion of the lead frame. The tie bar is connected to an exposed die attach pad that is downset from the bonding region of the tie bar. In some embodiments, the bonding region and the leads are at substantially the same elevation above the die and die attach pad. The die, bonding wires, and at least a portion of the lead frame can be encapsulated with a plastic encapsulant material while leaving a contact surface of the die attach pad exposed to facilitate electrically coupling the die attach pad to an external device.

15 Claims, 12 Drawing Sheets

LEADFRAME PACKAGES HAVING ENHANCED GROUND-BOND RELIABILITY

TECHNICAL FIELD

The present invention relates generally to lead frame based semiconductor packages. More particularly, arrangements that enhance the reliability of electrical connections between a die and a die attach pad that serves as a contact for the package are described.

BACKGROUND

Many semiconductor packages utilize a metal lead frame to provide electrical interconnects between an integrated circuit die and external components. Very small electrical wires referred to as "bonding wires" are often used to electrically connect I/O pads on the die (frequently referred to as "bond pad") to corresponding leads/contacts in the lead frame. Typically, the die, the bonding wires and portions of the lead frame are encapsulated in plastic for protection, while leaving portions of the lead frame exposed to facilitate electrical connection to external devices.

Many lead frames include a die attach pad (DAP) that supports the die during assembly of the package. In some such packages, the die attach pad is exposed on a surface of the package (typically the bottom surface). An exposed die attach pad can help with the thermal management of the package because the die attach pad provides a good thermal conduction path for dissipating excess heat generated by the die. In some exposed DAP packages, the die attach pad is also used as an electrical contact for the package. Most commonly, the die attach pad is used as the ground pad, although in a few packages it may be used as a power pad and theoretically it could alternatively be used as a signal pad.

When the die attach pad is used as an electrical contact, bonding wires are often used to electrically connect one or more ground I/O pads on the die to the die attach pad (a process frequently referred to as "down bonding"). Most commonly, very fine gold or copper wires are used as the bonding wires and the lead frame is formed from copper or a copper based alloy. Since gold does not adhere well to copper, the top surface of the die attach pad (and other relevant portions of the lead frame) are typically plated with a thin film of silver which adheres much better than copper to the gold bonding wires. A problem that occasionally occurs is that the die will sometimes delaminate from the die attach pad during use of the device. Delamination may also occur between the die attach pad and the mold compound that encapsulates the die. When delamination occurs, movement of the die relative to the die attach pad can sometimes detach the down bonding wires from the die attach pad or otherwise break the down bonding wires.

Similar delamination problems can also occur at the leads. For example, delamination sometimes occurs between the molding material and the lead fingers, particularly in the regions of the lead frame that are silver plated. Delamination between the molding material and the leads can also damage the bonding wires.

A representative lead frame suitable for use in a package having an exposed die attach pad is diagrammatically illustrated in FIGS. 1A and 1B. FIG. 1A is a top plan view of the lead frame 100 with a die attached and electrically connected to the lead frame. FIG. 1B is a cross-sectional side view of FIG. 1A taken along section line A-A. The die 102 is wire bonded to the grounded die attach pad 104 using ground bonding wires 106. One end of a ground bonding wire 106 attaches to a ground I/O pad 110 on the die 102, while the other end attaches directly to the die attach pad 104. In designs that use gold ground bonding wires 106, the grounded die attach pad 104 is often plated with silver in order to improve the quality of the bond. In addition, bonding wires 108 connect I/O pads 116 of the die 102 to associated leads 112 of the lead frame 124 in order to electrically connect the die as desired in the integrated circuit design. For example, bonding wires 108 may be used to connect the die 102 to a power source, signal line, or any other suitable electrical connection. The die attach pad 104 is supported by tie bars 118.

Although conventional ground bonding methods work well in many applications, there are continuing efforts to improve the reliability of ground bonds.

SUMMARY

To achieve the foregoing and other objects of the invention, one or more selected I/O pads (e.g., ground I/O pads) on a die are electrically coupled to a portion of a tie bar that carries a die attach pad, or a structure that is connected to such a tie bar. The bonding region is elevated above the die attach pad. Since the bonding wires that electrically connect the die to the die attach pad are bonded in a different plane then the die attach pad, the bonds are less likely to break or to be damaged should the die delaminate from the die attach pad. Downsetting the die attach pad from the bonding region permits more relative motion in the event of delamination, resulting in a ground bond with enhanced electrical reliability. In some preferred embodiments, the bonding region is wider than the other portions of the associated tie bar. Such an arrangement allows multiple ground I/O pads to be electrically coupled to the die attach pad.

Some embodiments may have a rectangular enlarged bonding region, while other embodiments may have a fused lead shape. The fused lead shape includes at least one finger portion that extends from the tie bar inwardly toward the die attach pad. The increased surface area of the enlarged bonding region allows for multiple groundbond locations on a tie bar. Also, in some designs, the lead frame may have multiple tie bars and enlarged bonding regions, which may be positioned on opposing sides of a die or at other suitable locations.

The semiconductor package may also be encapsulated in a plastic encapsulant in order to protect any associated devices. The back surface of the die attach pad is often exposed to facilitate electrical connections to external devices.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

In the following drawings, like reference numerals are sometimes used to designate like structural elements. It should also be appreciated that the depictions in the figures are diagrammatic and not to scale. The invention and the advantages thereof, may best be understood by reference to the following description taken in conjunction with the accompanying drawings in which.

DETAILED DESCRIPTION

The present invention relates generally to improved designs and techniques for electrically connecting selected I/O pads on a die (e.g. ground pads) to a die attach pad in lead frame based integrated circuit packages.

In the following description, numerous specific details are set forth in order to provide a thorough understanding of the present invention. It should be understood, however, that the present invention may be practiced without some or all of these specific details. In other instances, well-known process operations have not been described in detail in order to not unnecessarily obscure the present invention.

As described in the background section, some lead frame based integrated circuit packages are designed such that the die is electrically connected to ground by wire bonding the die directly to a grounded die attach pad portion of the lead frame. This process is frequently referred to as "down bonding." A problem that sometimes arises in down bonded packages, is that the die can sometimes delaminate from the die attach pad, potentially resulting in relative motion between the die and die attach pad. When such movement occurs, there is a risk that the down bonded bonding wires may be torn from the die attach pad or otherwise damaged or broken, which may result in poor electrical reliability.

To address this problem, the present invention describes an integrated circuit package, wherein selected ground I/O pads on the die are electrically coupled to a wire bonding landing region of a tie bar using bonding wires. The tie bar, which is part of the lead frame, is directly connected to, and mechanically supports the die attach pad during packaging, but generally is not itself intended for use as an electrical contact for the package. In many designs from the prior art, the tie bar is a thin piece of metal used only to support the die attach pad. The present application contemplates further using the tie bar as part of a ground plane for the integrated circuit package. The die mounting surface of the die attach pad is downset relative to the wire bonding landing region of the tie bar. In some embodiments, the wire bonding landing region is at the same elevation within the package as the leads. Although the described embodiments contemplate using the die attach pad as a ground contact, it should be understood that the die attach pad can be used as a contact for other functions, such as a power source or a signal terminal.

Figure 2A:
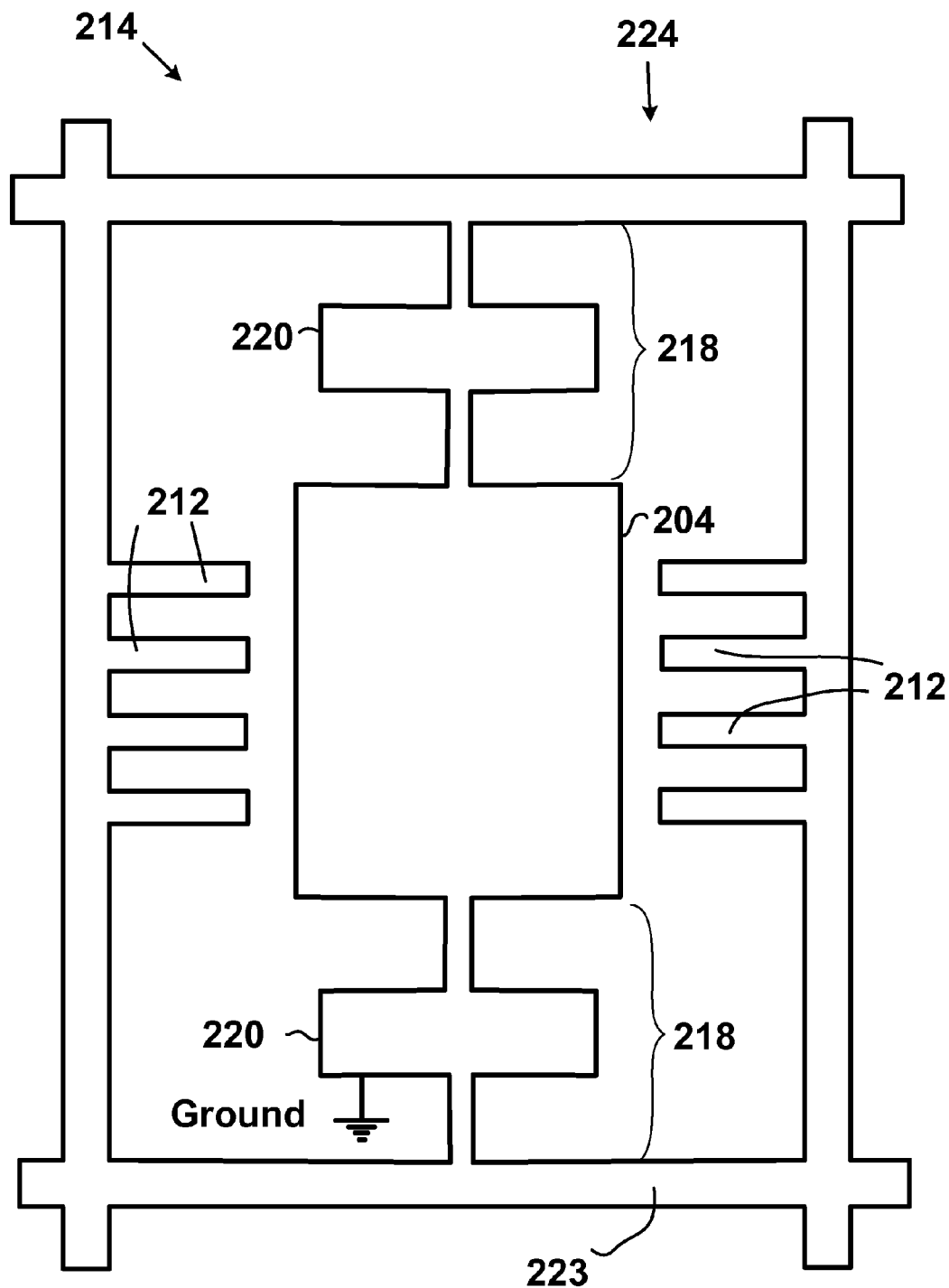
FIG. 2A illustrates a top plan view of a lead frame device area with an enlarged bonding region on the tie bars in accordance with one embodiment of the present invention.

Referring initially to FIGS. 2A-2D, a first embodiment of the present invention is shown. FIG. 2A illustrates a top plan view of one device area 214 of a lead frame panel 224, which includes leads 212, tie bars 218, and a die attach pad 204. In addition to these components, enlarged bonding regions 220 are integrally formed with the tie bars 218. The die attach pad 204 is carried by the tie bars 218 and is therefore electrically and mechanically coupled to the tie bars 218, which in turn are attached to support bars 223 in the lead frame panel 224. A plurality of leads 212 are also mechanically attached to the lead frame 224 and extend inwardly toward the die attach pad 204. The bonding region 220 may be grounded by electrically connecting to a grounded die attach pad 204 via the tie bars 218. When the lead frame is formed from copper or a copper alloy, it is generally desirable to plate the bonding region 220 with a silver film to enhance the adhesion of the gold bonding wires.

In this first embodiment, the bonding region 220 is formed as a rectangular area that is effectively a part of the tie bar 218. It will be appreciated, however, that the bonding region 220 may be formed at other suitable locations on the tie bar and may take any other suitable shapes and sizes. The bonding region 220 is typically wider than other portions of its associated tie bar 218. The larger region may be useful for a variety of reasons, such as providing greater surface area to bond multiple wires. Also, although two tie bars and enlarged bonding regions are shown in this embodiment, each device area 214 may have only one tie bar and bonding region, or, alternatively, more than two tie bars and bonding regions as required by the design of the die. FIG. 2A illustrates mechanically connecting two tie bars 218 to the die attach pad 204 on opposing sides of the die attach pad 204, but the tie bars 218 may also attach to any (or all) of the die attach pad corners.

Figure 2B:
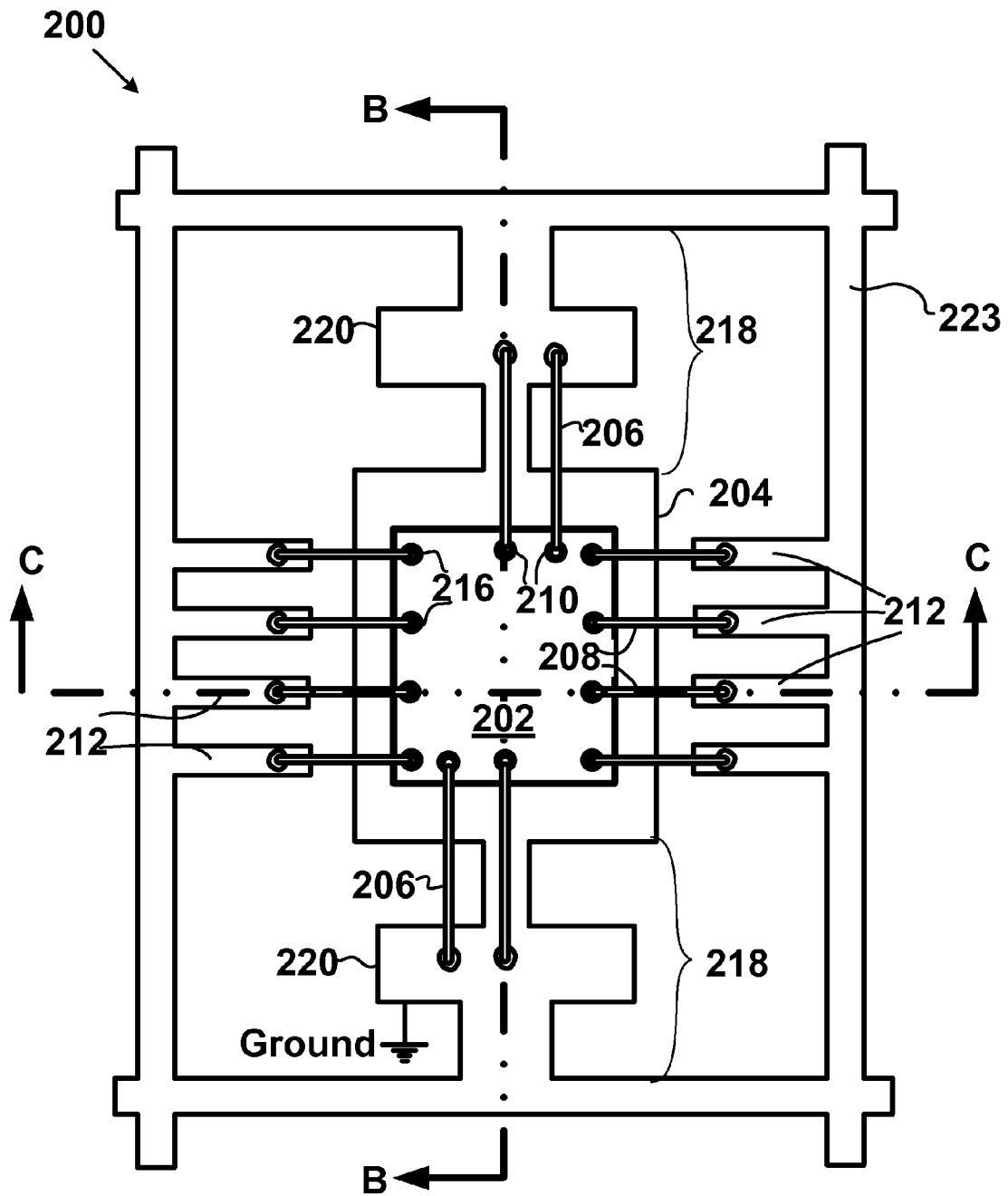
FIG. 2B illustrates a top plan view of an integrated circuit package that includes a die attached to the lead frame device area of FIG. 2A, with the die electrically coupled to enlarged bonding regions of the tie bars in accordance with one embodiment of the present invention.

FIG. 2B depicts a top plan view of an integrated circuit package 200. In FIG. 2B, a die 202 is mechanically affixed to the die mounting surface 226 of the die attach pad 204. The die includes a plurality of I/O pads (bond pads) on the active surface of the die 202. Each I/O pad in a first set of I/O pads 216 is designed to connect the die 202 to associated leads 212 of the lead frame 224. The I/O pads 216 may be used for a variety of purposes, including connecting the die 202 to power sources, signal lines, ground planes, or other suitable functions. As illustrated in FIG. 2B, the I/O pads 216 are electrically connected to the leads 212 using bonding wires 208. In a preferred embodiment, the bonding wires 208 are made of gold, although other suitable materials such as copper may be used. Moreover, the bonding wires are preferably bonded thermosonically, resulting in a gold ball bond at an I/O pad 216 and a stitch bond at a corresponding lead 212.

Each I/O pad in a second set of I/O pads 210 ("ground I/O pads") is designed to electrically connect the die 202 to a ground plane, which in this case is the enlarged bonding region 220. In the embodiment of FIGS. 2A-2D, the ground I/O pads 210 are bonded to the enlarged bonding regions 220 of the tie bars 218 via ground bonding wires 206. Preferably, the ground bonding wires are made of gold, and the bonds are created ultrasonically, resulting in a gold ball bond at an I/O pad 210 and a stitch bond at a corresponding enlarged bonding region 220. Although two ground bonding wires 206 connect to each bonding region 220 in FIG. 2B, it may be useful in some embodiments to connect only one or, alternatively, greater than two ground bonding wires to a single bonding region. Integrated circuit package 200 may also include an encapsulant, which is not shown in FIG. 2B.

Figure 1A:
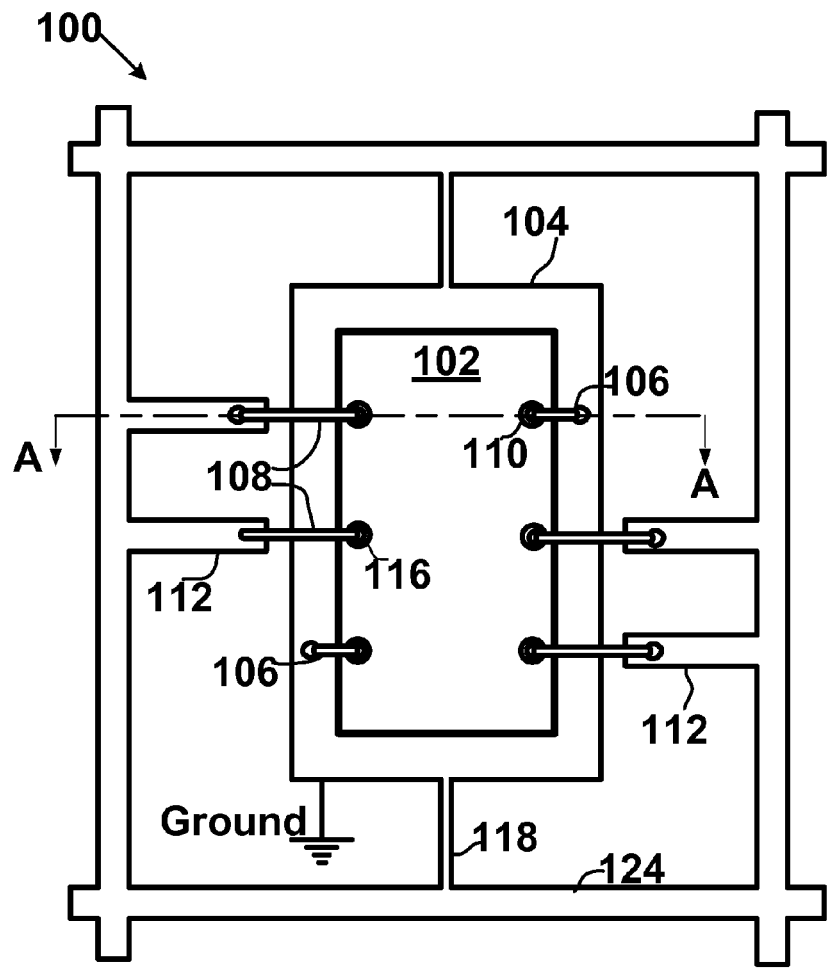
FIG. 1A illustrates a top plan view of a prior art integrated circuit package, in which ground bond pads on the die are down bonded to a grounded die attach pad.
Figure 1B:
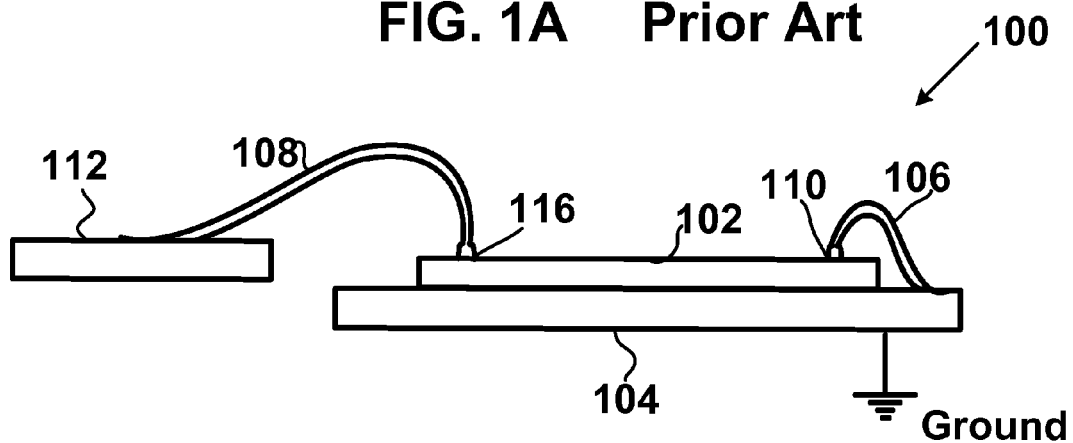
FIG. 1B illustrates a side cross-sectional view of the package shown in FIG. 1A, taken along section A-A.
Figure 2C:
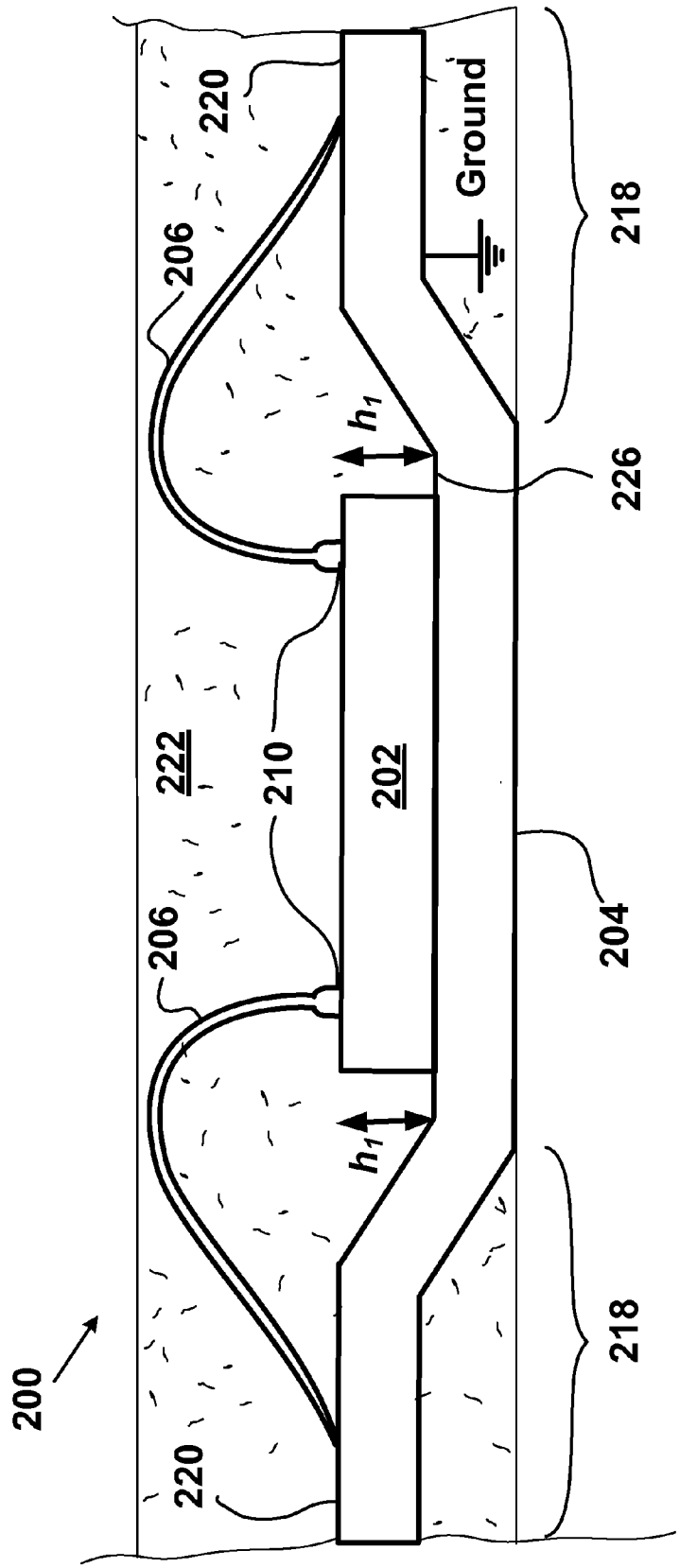
FIG. 2C illustrates a side cross-sectional view taken along section B-B of the embodiment of FIG. 2B, which shows the ground bonding wires electrically coupled to the elevated bonding regions of the tie bars in accordance with one embodiment of the present invention.

FIG. 2C illustrates a side cross-sectional view of the package 200 presented in FIG. 2B, taken along section B-B. As shown in the drawing, the die mounting surface 226 of the die attach pad 204 is preferably downset from the enlarged bonding regions 220 of the tie bars 218 by a distance $h_1$. Coupling the ground bonding wires 206 to an elevated, enlarged bonding region 220 improves the electrical reliability of the groundbond. The connection is less susceptible to damage due to die delamination, because the loop created by the ground bonding wires permits more relative motion than the prior art designs, such as that which is shown in FIG. 1. Relative motion between the die and die attach pad is therefore less likely to result in damage to the ground bonding wires 206.

Figure 2D:
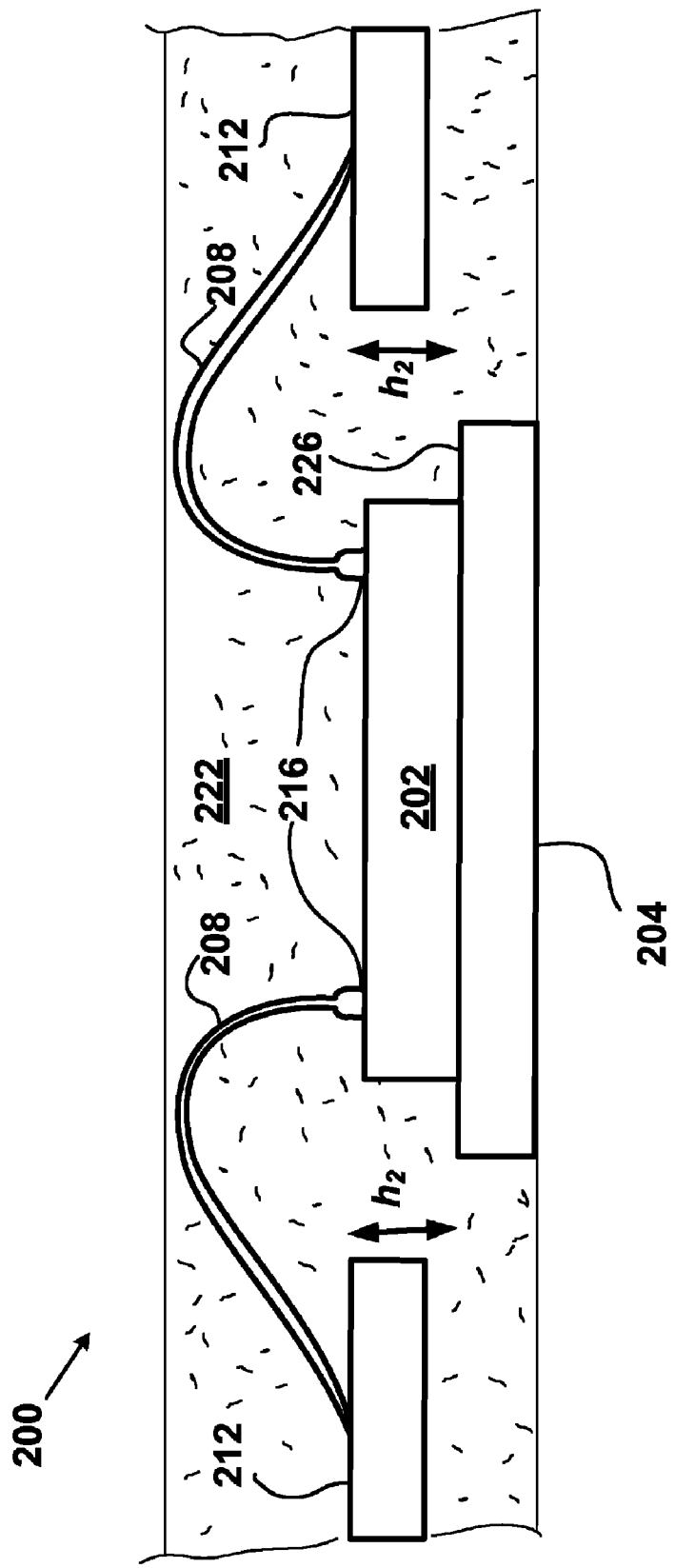
FIG. 2D illustrates a side cross-sectional view taken along section C-C of the embodiment of FIG. 2B, which shows the bonding wires electrically coupled to the leads in accordance with one embodiment of the present invention.

FIG. 2D is a side cross-sectional view of the package 200 presented in FIG. 2B, taken along section C-C. The leads 212 extend inwardly toward the die 202. Although the leads 212 do not directly overlie the die 202 in FIG. 2D, one skilled in the art would appreciate that the leads 212 may be positioned differently. The die mounting surface 226 of the die attach pad 204 is downset from the leads 212 by a distance $h_2$. The distance $h_2$ may be larger or smaller than the distance $h_1$ shown in FIG. 2C. In a preferred embodiment, however, the distances $h_1$ and $h_2$ are substantially equivalent, such that the enlarged bonding regions 220 and the leads 212 are positioned at approximately the same elevation above the die mounting surface 226.

Figure 6:
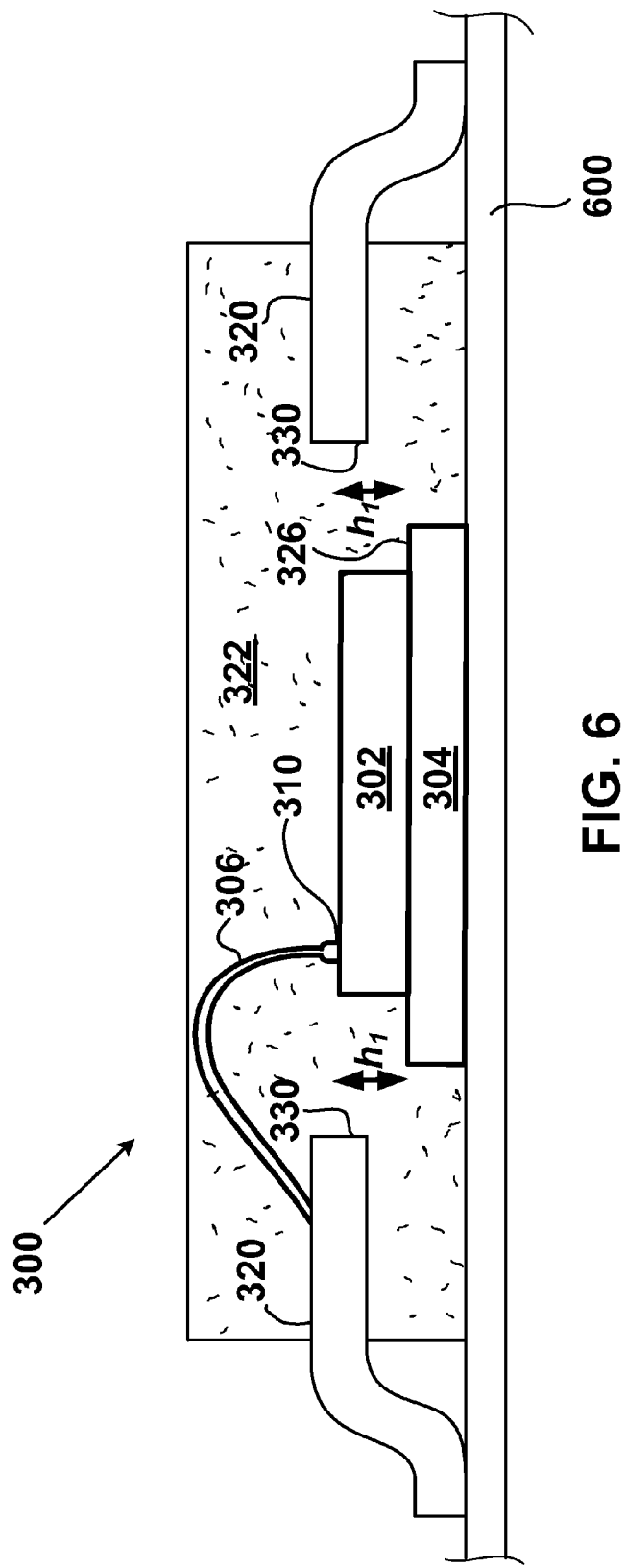
FIG. 6 illustrates a package formed in accordance with one embodiment of the present invention that is mounted on a substrate.

Portions of the die 202, die attach pad 204, leads 212, I/O pads 216, ground I/O pads 210, bonding wires 208, ground bonding wires 206, and tie bars 218 may be encapsulated within the encapsulant or molding material 222. The molding compound is generally a non-conductive plastic or resin. In the embodiment illustrated in FIGS. 2C and 2D, the outer portions of the leads 212 extend from the sides of the encapsulated package 200 to facilitate electrical connection with a suitable substrate 600 as illustrated in FIG. 6. This listing of claims will replace all prior versions, and listings, of claims in the application:

The bottom surface of the die attach pad 204 is exposed through the encapsulant 222 to facilitate electrically coupling the die attach pad 204 to an electrical ground plane. Since the die attach pad 204 is electrically connected to the bonding region 220 of the tie bar 218, this presents one method of electrically connecting the ground I/O pads to ground.

Figure 3A:
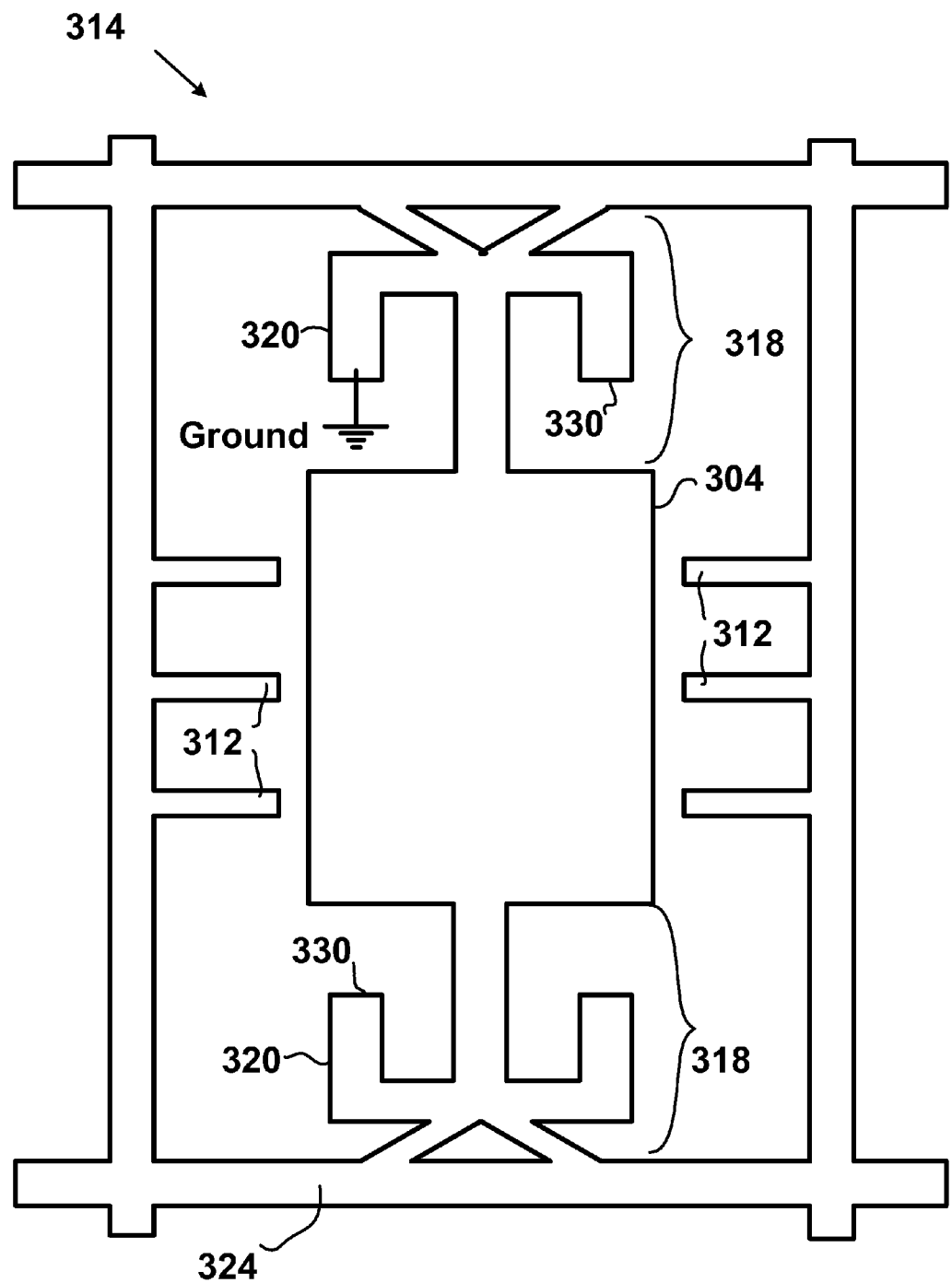
FIG. 3A illustrates a top plan view of a lead frame device area having an enlarged bonding region on the tie bars in accordance with another embodiment of the present invention.
Figure 3B:
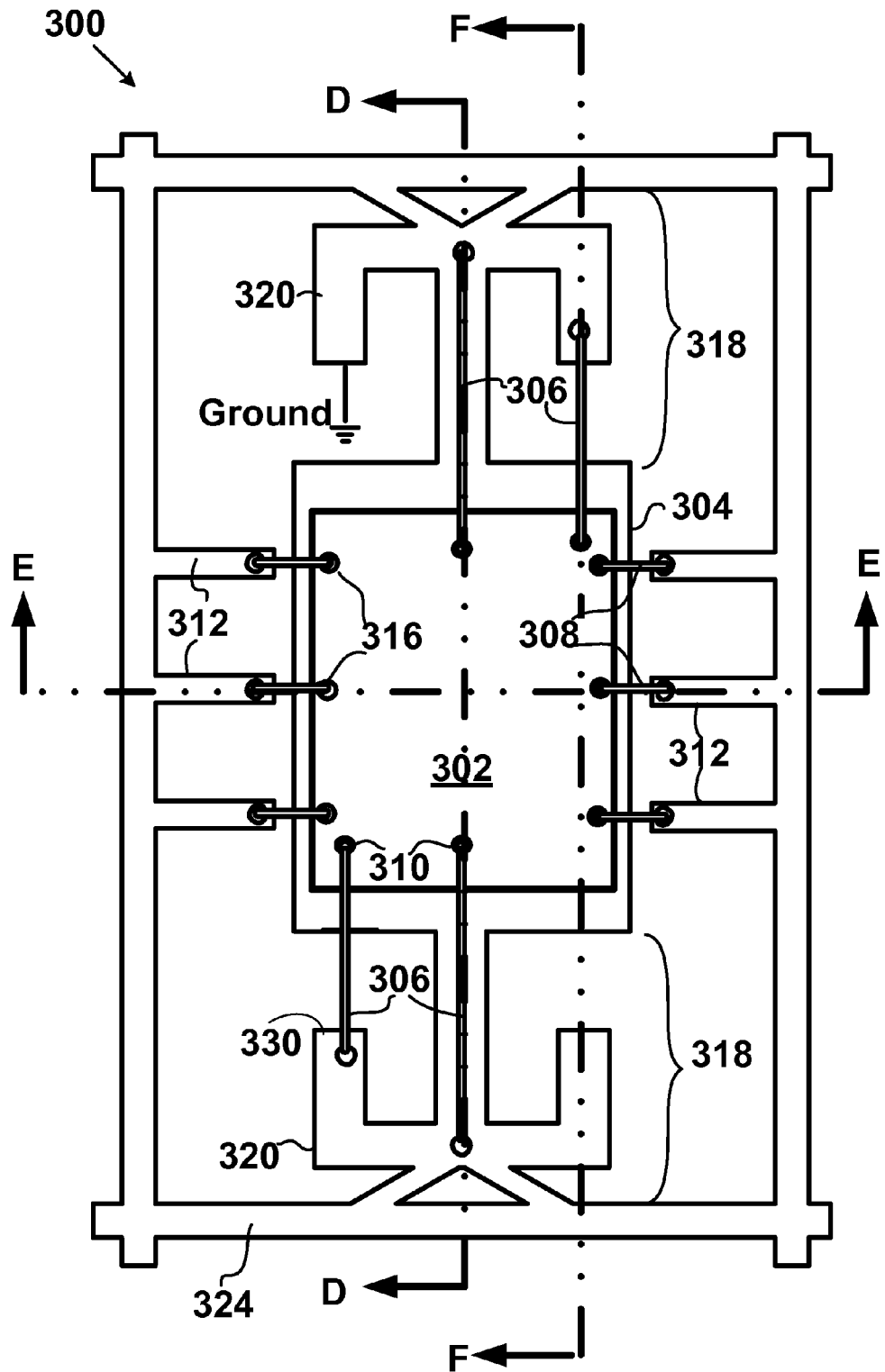
FIG. 3B illustrates a top plan view of an integrated circuit package that includes a die attached to the lead frame device area of FIG. 3A, with the die electrically coupled to enlarged grounded regions of the tie bars in accordance with another embodiment of the present invention.
Figure 3C:
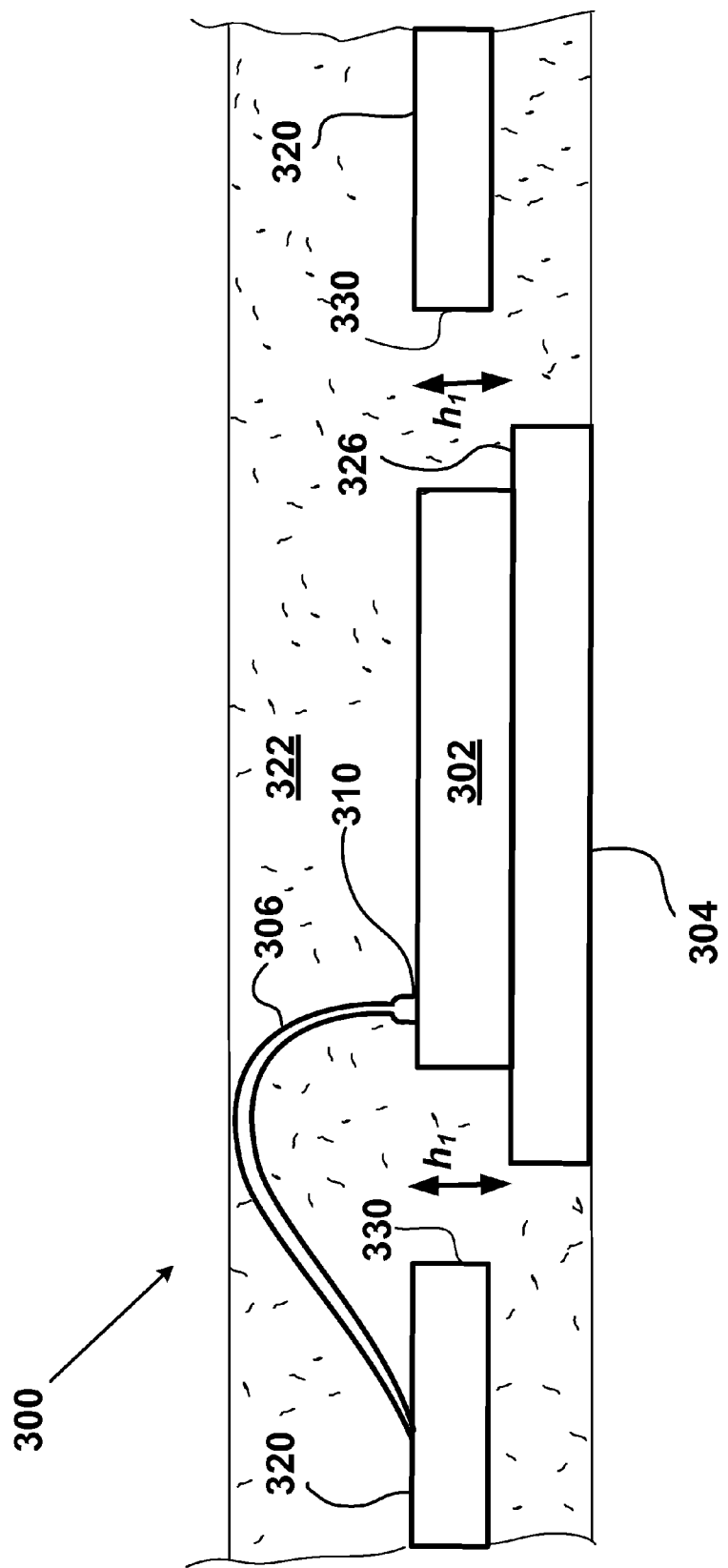
FIG. 3C illustrates a side cross-sectional view of the integrated circuit package of FIG. 3B, taken along section F-F, wherein the ground I/O pads are coupled to the enlarged bonding regions of the tie bars in accordance with one embodiment of the present invention.

Referring next to FIGS. 3A-3C another embodiment in accordance with the present invention will be described. Many features in this embodiment are substantially similar to the features of FIGS. 2A-2D, though several differences are presented herein. FIG. 3A shows a lead frame device area 314 having enlarged bonding regions 320 on the tie bars 318 and having multiple leads 312 extending inwardly toward the die attach pad 304. The shape of the enlarged bonding region 320 of FIG. 3A, a fused lead shape, includes at least one finger portion 330 that extends from the tie bar 318 inwardly toward the die attach pad 304. The large surface area of the bonding region 320 allows for multiple ground bond locations on a single tie bar 318. The bonding region 320, in turn, is electrically connected to the die attach pad 304 through the tie bar 318.

FIG. 3B depicts a top view of an integrated circuit package 300 with a die 302 attached to the die attach pad 304. Like the embodiment of FIG. 2B, bonding wires 308 electrically connect selected I/O pads 316 from the die 302 to the leads 312. The I/O pads 316 may be used for a variety of purposes, including connecting the die 302 to power sources, signal lines, ground planes, or other suitable functions. In a preferred embodiment, the bonding wires 308 are made of gold. Moreover, the bonding wires 308 are preferably bonded ultrasonically, resulting in a gold ball bond at an I/O pad 316 and a stitch bond at a corresponding lead 312.

A second set of I/O pads 310 is designed to electrically connect the die 302 to a ground plane. In the present embodiment, the ground I/O pads 310 are bonded to the enlarged bonding regions 320 of the tie bars 318 via ground bonding wires 306. Preferably, the ground bonding wires 306 are made of gold, and the bonds are created ultrasonically, resulting in a gold ball bond at an I/O pad 310 and a stitch bond at a corresponding enlarged bonding region 320.

Side views of the embodiment shown in FIG. 3B taken along sections D-D and E-E can be substantially similar to those depicted in the embodiment of FIGS. 2C and 2D, respectively, when scaled appropriately. As one notable difference between the embodiments, FIG. 3C illustrates a side cross-sectional view of the integrated circuit package 300 taken along section F-F of FIG. 3B. The ground bonding wire 306 electrically connects the ground I/O pad 310 to the enlarged bonding region 320 of the tie bar 318. In the drawing of FIG. 3C, the ground bonding wire 306 is bonded ultrasonically to a finger portion 330 of the bonding region 320 that extends inwardly toward the die.

Like the embodiments shown in FIGS. 2A-2D, the die mounting surface 326 of the die attach pad 304 is downset from the enlarged bonding regions 320 by a distance $h_1$ and is downset from the leads 312 by a distance $h_2$. Although these distances need not be equal, the bonding regions 320 and the leads 312 can be at substantially the same elevation above the die mounting surface 326 of the die attach pad 304. The elevated positioning of the enlarged bonding region 320 improves the reliability of the ground bond by reducing the associated stresses on the ground bonding wires 306.

Similar to the embodiment described above, the integrated circuit package 300 is preferably enclosed within an encapsulant or molding material 322. The back surface of the die attach pad 304 is exposed through the encapsulant 322 to connect to a ground plane, as disclosed in detail above.

Figure 4A:
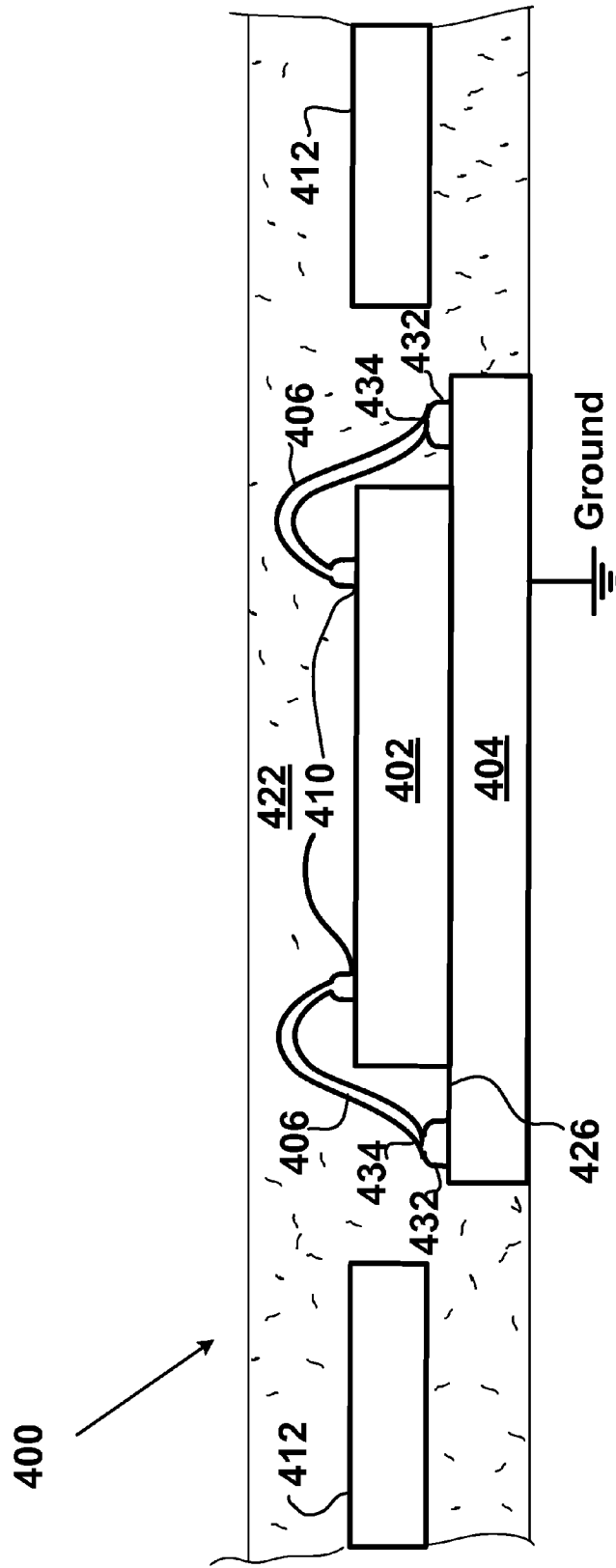
FIG. 4A illustrates a side cross-sectional view of an integrated circuit package, wherein a bonding wire is coupled directly to the die attach pad via a ball bond with wedge stitched on ball. (BSOB).
Figure 4B:
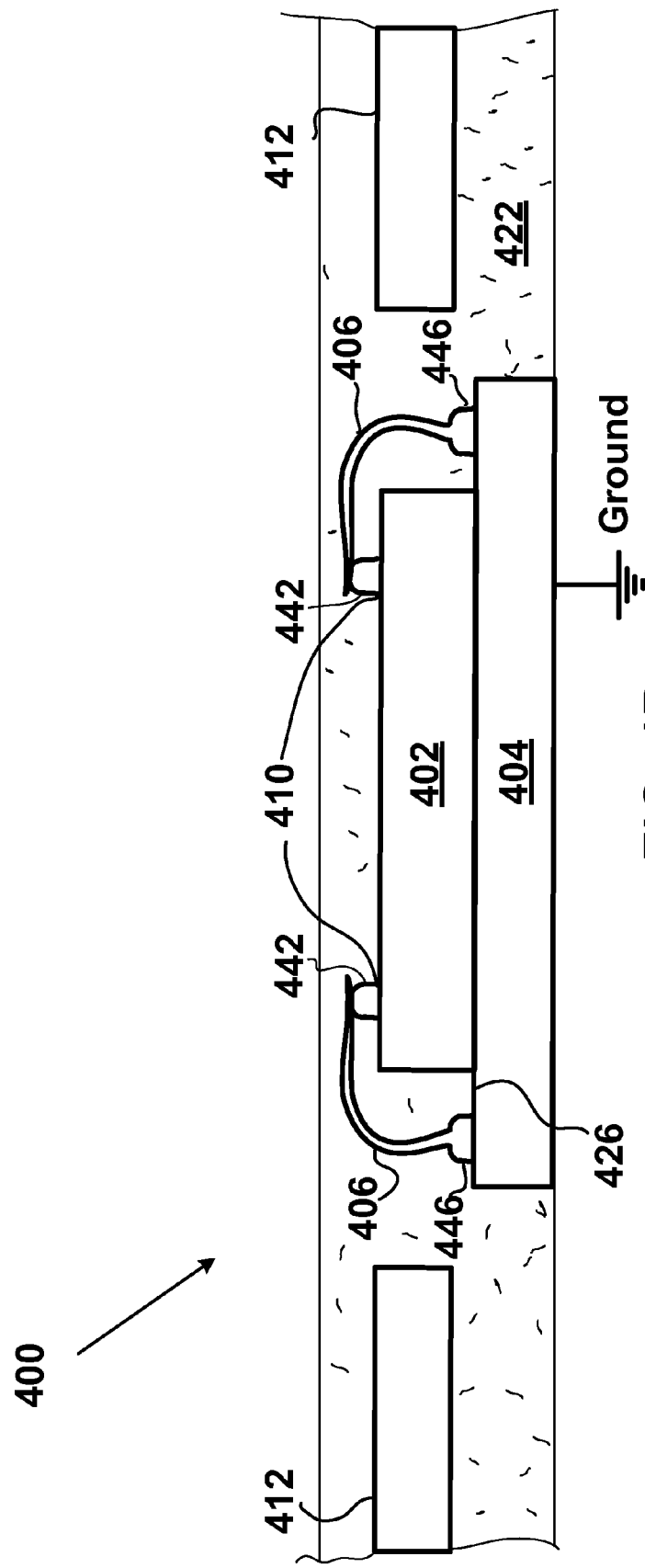
FIG. 4B illustrates a side cross-sectional view of an integrated circuit package, wherein a bonding wire is coupled directly to the die attach pad via a reverse ball stitched on ball. (RBSOB).

FIGS. 4A and 4B present yet another approach to improving ground bond reliability in integrated circuit packages. In the embodiment illustrated in FIG. 4, some of the ground I/O pads 410 on the die 402 are coupled directly to the grounded die attach pad 404 using a ball bond with wedge stitched on ball (BSOB) technique. As can be seen in FIG. 4A, a wire bonding bump 432 is initially created on the die mounting surface 426 of the grounded die attach pad 404. The bump 432 is made by using a standard wire bonding capillary to ultrasonically deposit a ball bond onto the grounded die attach pad 404. Rather than continuing the extrusion of the wire, the capillary truncates the wire near the top of the ball bond bump 432, such that only a wire bonding "ball" or "bump" 432 remains atop the die attach pad 404. The bump 432 may be created using more force than normally used for wire bonding, which has the effect of flattening the bump thereby increasing its bonding surface area and increasing the strength of the resultant bump.

The ground I/O pad 410 is then wire bonded to the bump 432 using bonding wires 406. The bonding wires 406 may be formed from gold, copper or other suitable conductive materials. During the wire bonding process, a second ball bond is preferably formed at the ground I/O pad 410, and a stitch bond 434 may be formed on top of the bump 432. Thus, the bonding wires 406 electrically couple to the grounded die attach pad 404 via a stitch bond 434 located atop the bump 432. In some embodiments, the bump 432 is approximately one-third the height of the ball bond at the ground I/O pad 410. If the die attach pad 404 is plated with silver, the embodiment disclosed in FIG. 4 improves the reliability of the ground bond. This is because the ball bond bump 432 adheres to the silver-plated die attach pad 404 better than a stitch bond. Thus, the bump 432 provides an interface between the bonding wires 406 and the die mounting surface 426 of the die attach pad 404, thereby reducing the shear stress in the bonding wires 406 and improving reliability.

An alternative stitch on ball technique is illustrated in FIG. 4B. In this embodiment, an initial bump 442 is formed on a ground I/O pad 410 pad on the die 402. A bonding wire 406 is then used to electrically connect the die attach pad 404 to the bump 442 on I/O pad 410. During the wire bonding process, a second ball bond 446 is formed on the die attach pad 404. Again, the wire bonder may utilized more bonding force than normal, which has the effect of flattening the bump, thereby bond strength and surface area.

Figure 5A:
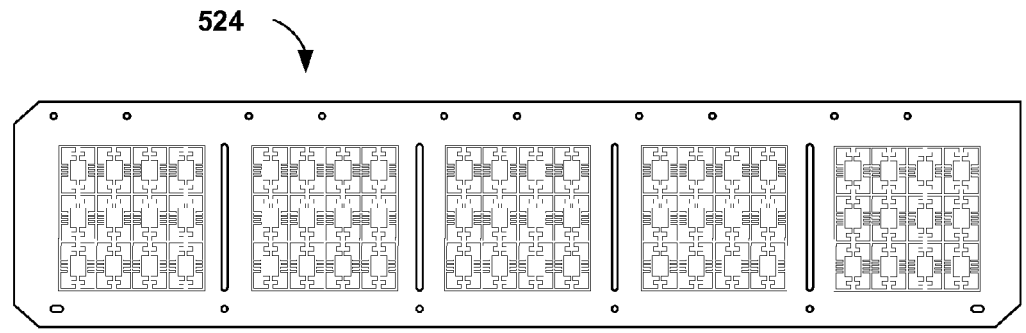
FIGS. 5A-5C illustrate in top plan views a lead frame strip 524 containing multiple device areas 514 in accordance with one embodiment of the present invention.
Figure 5B:
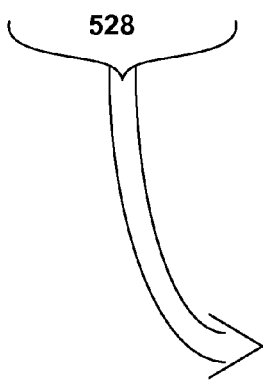
Figure 5B:
Figure 5B:
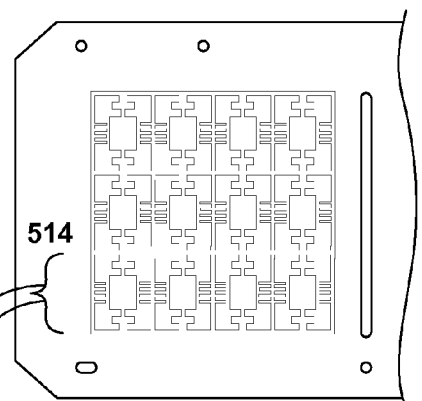
Figure 5C:
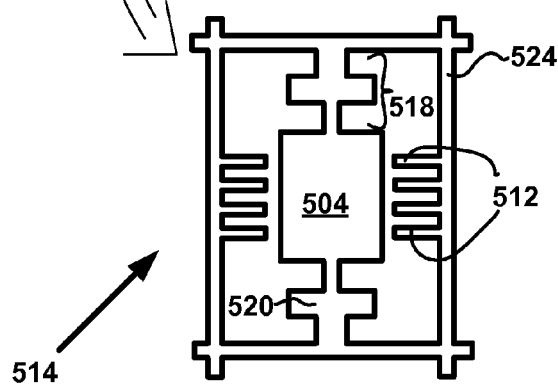

Referring next to FIGS. 5A-5C, yet another embodiment of the present invention will be described. As will be familiar to one of skill in the art, it is often useful to assemble integrated circuit packages using a lead frame strip 524 that supports an array 528 of device areas 514. Such a configuration allows for the mass production of integrated circuit packages. Although FIGS. 5A-5C depict device areas similar to those presented in FIGS. 2A-2D, it should also be appreciated that the lead frame may support the embodiments of FIGS. 3A-3C and FIG. 4, as well as any other suitable embodiments.

FIG. 5A depicts a portion of a lead frame strip 524 that has a multiplicity of device areas 514. Typically the device areas 514 are arranged in at least one two dimensional array 528 on the panel 524, although a variety of other arrangements are possible (e.g. a one dimensional array, non-linear arrangements, etc.). In the illustrated embodiment, five two-dimensional arrays 528 of device areas 514 are shown. However it should be appreciated that more or fewer arrays 528 may be provided. The lead frame panels 524 are typically formed from copper or a copper based alloy, although other suitable materials (e.g., aluminum) may be used in various alternative embodiments. Each device area 514 may contain an integrated circuit package as described in any of the above embodiments. After the package is assembled onto the lead frame 524, the lead frame 524 is singulated as necessary to yield multiple, individual integrated circuit packages that are ready for use in any desired application. The singulation may be arranged to sacrifice the tie bars 518 and may electrically isolate the leads 512 from the die attach pad portion 504 of the lead frame 524.

The present invention may also be employed in any suitable integrated circuit packaging style. In the embodiments of FIGS. 2A-2D and FIGS. 3A-3C, for example, the integrated circuit package 200 may be used as a dual in-line package (DIP) that has two rows of leads 212 on opposing sides of the die 202. Of course, the disclosed packages may also be useful in a variety of other packaging styles, such as quad flat packages (QFP) and thin small outline packages (TSOP).

Although only a few embodiments of the invention have been described in detail, it should be appreciated that the invention may be implemented in many other forms without departing from the spirit or scope of the invention. For example, in addition to coupling to an electrical ground plane, the enlarged bonding regions may also be used to couple to a power source or signal input.

In the illustrated embodiments that contemplated wire bonding to a region of the tie bars, the die attach pad is downset relative to both the leads and the wire bonding regions of the tie bars. However, in some packages (e.g., QFN or LLP packages) it may be desirable for bottom surfaces of the leads to serve as contacts that are co-planar with the bottom surface of the die attach pad. In such embodiments it may be desirable to up-set the bonding regions of the die attach pad so that the lead contacts and the die attach pad remain substantially co-planar. Therefore, the present embodiments should be considered illustrative and not restrictive, and the invention is not to be limited to the details given herein, but may be modified within the scope and equivalents of the appended claims.

What is claimed is:

1. An integrated circuit package comprising:
a lead frame including a die attach pad, a plurality of leads that are physically and electrically isolated from the die attach pad, and a first tie bar integrally formed with the die attach pad and mechanically and electrically coupled to the die attach pad, the first tie bar including a first bonding region, wherein the die attach pad is downset relative to the leads and has a die mounting surface that is downset relative to the first bonding region;
the tie bar has a first appendage that directly attaches to the die attach pad and includes a downset portion that transitions between the level of the die attach pad and the level of the leads;
at least one finger portion that is spaced apart from the first appendage and extends inwardly toward the die;
the first bonding region is on the finger portion;
a die mounted on the die mounting surface of the die attach pad, the die having a multiplicity of I/O pads;
a first set of bonding wires, wherein each bonding wire in the first set of bonding wires has a first end attached to an associated I/O pad and a second end attached to an associated lead to thereby electrically couple the associated I/O pad to the associated lead; and
a second set of bonding wires, there being at least one bonding wire in the second set of bonding wires, each bonding wire in the second set of bonding wires having a first end attached to an associated I/O pad on the die and a second end attached to the first bonding region on the first tie bar, whereby the attachment point of each bonding wire in the second set of bonding wires to the first bonding region is offset relative to a plane that encompasses the die mounting surface; and
wherein the die attach pad and each of the leads serve as electrical contacts for the package and the tie bar is not electrically coupled to any leads that serve as an electrical contact for the package, and wherein the package is a dual in-line package having two rows of leads on opposing sides of the package and no leads on opposing ends of the package that extend substantially perpendicularly relative to the opposing sides of the package, and wherein the first tie bar extends towards an end of the package that has no leads such that no portion of the tie bar including the first bonding regions extends between the die attach pad and any of the leads.

2. An integrated circuit package as recited in claim 1, wherein the die attach pad is electrically coupled to ground and wherein each I/O pad attached to a bonding wire in the second set of bonding wires is a ground I/O pad.

3. An integrated circuit package as recited in claim 1, wherein the width of the first bonding region is substantially larger than the width of other portions of the first tie bar.

4. An integrated circuit package as recited in claim 1, further comprising a plastic encapsulant that encapsulates the die, the bonding wires and at least a portion of the lead frame while leaving a bottom surface of the die attach pad exposed to serve as an electrical contact.

5. An electronic device including:
a substrate having a ground pad;
an integrated circuit package as recited in claim 4 mounted on the substrate, wherein each I/O pad attached to a bonding wire in the second set of bonding wires is a ground I/O pad and the bottom surface of the die attach pad is coupled electrically and mechanically to the substrate ground pad, to thereby electrically connect the ground I/O pads to ground through the bonding wires, the first tie bar and the die attach pad.

6. An integrated circuit package as recited in claim 5, wherein the package is a dual in-line package having two rows of leads on opposing sides of the package and no leads extending from opposing ends of the package, and wherein the first tie bar extends towards an end of the package that has no leads.

7. An integrated circuit package as recited in claim 1, wherein the second set of bonding wires include a plurality of bonding wires that are each coupled to the first bonding region.

8. An integrated circuit package as recited in claim 1, further comprising:
a second tie bar integrally formed with the die attach pad and having a second bonding region, wherein at least one additional bonding wire is attached to the second enlarged bonding region.

9. An integrated circuit package as recited in claim 8, wherein top surfaces of the first and second bonding regions are substantially co-planar with top surfaces of the leads.

10. An integrated circuit package as recited in claim 1 further including
at least one wire bonding bump is ball bonded the die attach pad;
and wherein at least one of the bonding wires of the first and second set of bonding wires is a down bonding wire that is indirectly secured to the die attach pad, wherein each down bonding wire is stitch bonded to an associated wire bonding bump to electrically connect the down bonding wire to the die attach pad.

11. An integrated circuit package as recited in claim 10 wherein the wire bonding bump is a ball bond bump attached to the die attach pad by a ball bond and the wire bonding bump is formed from the same material as the bonding wires.

12. An integrated circuit package as recited in claim 11 wherein the wire bonding bump is ultrasonically bonded to the die attach pad by a wire bonding capillary.

13. An integrated circuit package as recited in claim 11 wherein the wire bonding bump is formed from gold.

14. An integrated circuit package as recited in claim 11 wherein each down bonding wire has a bonding wire ball bond attached to the associated I/O pad and the height of the wire bonding bump is about one third the height of the bonding wire ball bond.

15. An integrated circuit package as recited in claim 13 wherein the lead frame is formed from copper or a copper based alloy, the die attach pad is silver plated and gold wire bonding bump is attached to the silver plating.

* * * * *